(12) United States Patent
Aipperspach et al.

(10) Patent No.: US 11,018,084 B2
(45) Date of Patent: May 25, 2021

(54) MANAGED INTEGRATED CIRCUIT POWER SUPPLY DISTRIBUTION

(71) Applicant: International Business Machines Corporation, Armonk, NY (US)

(72) Inventors: Anthony G. Aipperspach, Rochester, MN (US); Jeffrey D. Brown, Rochester, MN (US); Kirk D. Peterson, Jericho, VT (US); John E. Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/523,060

(22) Filed: Jul. 26, 2019

(65) Prior Publication Data

US 2019/0348361 A1  Nov. 14, 2019

Related U.S. Application Data

(63) Continuation of application No. 15/814,776, filed on Nov. 16, 2017, now Pat. No. 10,580,730.

(51) Int. Cl.
| | |
|---|---|
| *H01L 23/50* | (2006.01) |
| *H03K 19/177* | (2020.01) |
| *H01L 23/528* | (2006.01) |
| *G06F 30/30* | (2020.01) |
| *H03K 19/17736* | (2020.01) |
| *H03K 19/17784* | (2020.01) |
| *G11C 5/14* | (2006.01) |

(52) U.S. Cl.
CPC .............. *H01L 23/50* (2013.01); *G06F 30/30* (2020.01); *H01L 23/5286* (2013.01); *H03K 19/1774* (2013.01); *H03K 19/17784* (2013.01); *G11C 5/14* (2013.01)

(58) Field of Classification Search
CPC ............... H01L 23/50; H01L 23/5286; H03K 19/17784; H03K 19/1774; G11C 5/14; G06F 30/30; G06F 17/5045
USPC .......................... 716/118, 119, 120, 127, 133
See application file for complete search history.

(56) References Cited

U.S. PATENT DOCUMENTS

| 5,832,284 A | 11/1998 | Michail et al. |
| 6,420,797 B1 | 7/2002 | Steele et al. |
| (Continued) | | |

OTHER PUBLICATIONS

List of IBM Patents or Patent Applications Treated as Related, Signed Jul. 26, 2019, 2 pages.

*Primary Examiner* — Sun J Lin
(74) *Attorney, Agent, or Firm* — Alex Harvey

(57) ABSTRACT

An integrated circuit (IC) can be configured to provide a managed power distribution to circuits within a plurality of regions of the IC. Each region of the plurality of regions can include a corresponding set of circuits that are electrically connected to a corresponding virtual power island (VPI) within said each region. A global power distribution structure within the IC can be configured to be electrically interconnected to an off-chip voltage supply. The IC can also include a plurality of sets of vertical interconnects (VIs), each set of VIs electrically interconnected to a VPI within a corresponding region. Each set of VIs can also be connected to the global power distribution structure, and can be used to provide a specifically managed voltage through a VPI to a set of circuits within a corresponding region of the IC.

20 Claims, 4 Drawing Sheets

(56) References Cited

U.S. PATENT DOCUMENTS

| | | | |
|---|---|---|---|
| 6,631,502 B2 * | 10/2003 | Buffet et al. | G06F 30/367 |
| | | | 716/111 |
| 6,772,356 B1 | 8/2004 | Qureshi et al. | |
| 6,868,503 B1 | 3/2005 | Maksimovic et al. | |
| 7,051,306 B2 | 5/2006 | Hoberman et al. | |
| 7,392,413 B2 | 6/2008 | Shikata | |
| 7,415,680 B2 | 8/2008 | Hoberman et al. | |
| 7,506,189 B1 | 3/2009 | Lee et al. | |
| 7,511,528 B2 | 3/2009 | Arsovski et al. | |
| 7,962,887 B2 | 6/2011 | Anderson et al. | |
| 8,386,737 B2 | 2/2013 | Jeon et al. | |
| 8,547,164 B2 | 10/2013 | Flores et al. | |
| 9,020,655 B2 | 4/2015 | Brower | |
| 9,058,459 B1 | 6/2015 | Dangat et al. | |
| 9,098,438 B2 | 8/2015 | Flores et al. | |
| 9,342,123 B2 | 5/2016 | Bacha | |
| 10,580,730 B2 * | 3/2020 | Aipperspach et al. | |
| | | | H01L 23/50 |
| 2007/0228830 A1 | 10/2007 | Bernstein et al. | |
| 2012/0104847 A1 | 5/2012 | Roscoe et al. | |
| 2016/0124478 A1 | 5/2016 | Beeston et al. | |
| 2019/0148284 A1 | 5/2019 | Aipperspach et al. | |

* cited by examiner

MANAGED INTEGRATED CIRCUIT POWER SUPPLY DISTRIBUTION

BACKGROUND

The present disclosure generally relates to integrated circuits (ICs). In particular, this disclosure relates to the management of the power supply voltages to regions of an IC.

An IC, also known as a "microchip," silicon or computer "chip," is a specially prepared piece of silicon, or other semiconductor material, into which a complex electronic circuit is etched and formed using a photolithographic process. IC types can include computer processors, memory, analog, and customizable devices. ICs can be relatively fragile, and therefore are often mounted on and/or surrounded by a protective, supportive ceramic or plastic package. Electrical connections to the chip can be provided through metal contacts, which can include pins or solder balls located on the exterior of the chip package.

ICs can have certain advantages over comparable discrete circuits, such as relatively low cost and high performance. The cost of an IC can be relatively low, resulting from the large number, e.g., millions, of transistors that can be simultaneously printed as a complete functional unit by photolithographic techniques, rather than constructing an equivalent circuit from individually fabricated transistors. Performance of an IC can be significantly higher than an equivalent discrete circuit due to the high density and relatively low electrical interconnect parasitics between active devices such as transistors. Types of ICs may include analog, digital and "mixed signal" chips, i.e., chips that incorporate both analog and digital functions on the same silicon die.

During the operation of an IC, electrical power consumed by the IC is dissipated as heat. The amount of heat an IC dissipates may be proportional to its operating voltage(s) and frequency, and the number of inputs, outputs, and active circuits within the IC. High operating temperatures resulting from excessive heat dissipation can shorten the operating life of an IC by causing premature failure, and can reduce its operating capability.

SUMMARY

Embodiments may be directed towards an integrated circuit (IC) configured to provide managed power distribution to circuits within a plurality of regions of the IC. The IC may include the plurality of regions of the IC, each region of the plurality of regions including a corresponding set of circuits that are electrically connected to a corresponding virtual power island (VPI) within the region. The IC may also include a global power distribution structure configured to be electrically interconnected to an off-chip voltage supply. The IC may also include a plurality of sets of vertical interconnects (VIs), each set of VIs of the plurality of sets of VIs being electrically interconnected to a VPI within a corresponding region of the plurality of regions. Each set of VIs of the plurality of sets of VIs is also connected to the global power distribution structure.

Embodiments may also be directed towards a method for designing and fabricating an IC having a managed power distribution structure. The method may include creating, with a timing estimation program in conjunction with a model of a preliminary power distribution structure, a set of preliminary timing estimates for circuits on the IC. The method may also include dividing, with an electronic design automation (EDA) program in conjunction with the set of preliminary timing estimates, the IC into a plurality of regions, each region of the plurality of regions including a corresponding VPI electrically interconnected to circuits within the each region. The method may also include identifying with the timing estimation program, a worst-case timing path for circuits within each respective region of the plurality of regions and calculating, with a circuit simulation program, an alternating current (AC) draw and a direct current (DC) draw for circuits within each region of the plurality of regions. The method may also include calculating with the EDA program, a worst-case AC transient current draw for circuits within each region of the plurality of regions and calculating, with the EDA program, resistances of a plurality of sets of VIs. Each set of VIs of the plurality of sets of VIs is electrically interconnected to a global power distribution structure and to a corresponding VPI within each region of the plurality of regions. The resistances of the plurality of sets of VIs are calculated to manage timing of the circuits within each region of the plurality of regions. The method may also include modifying, with an IC layout program, in accordance with the calculated resistances of the plurality of sets of VIs, the preliminary power distribution structure to create a managed power distribution structure. The managed power distribution structure, during operation of the IC, provides managed timing of the circuits within each region of the plurality of regions.

Embodiments may also be directed towards a design structure embodied on a non-transitory computer-readable storage medium readable by a machine used in design, manufacture, and simulation of an IC. The design structure can include elements that, when processed in a semiconductor manufacturing facility, produce an IC. The IC can be configured to provide managed power distribution to circuits within a plurality of regions of the IC. The IC may include the plurality of regions of the IC, each region of the plurality of regions including a corresponding set of circuits that are electrically connected to a corresponding VPI within the region. The IC may also include a global power distribution structure configured to be electrically interconnected to an off-chip voltage supply. The IC may also include a plurality of sets of VIs, each set of VIs of the plurality of sets of VIs being electrically interconnected to a VPI within a corresponding region of the plurality of regions. Each set of VIs of the plurality of sets of VIs is also connected to the global power distribution structure.

The above summary is not intended to describe each depicted embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
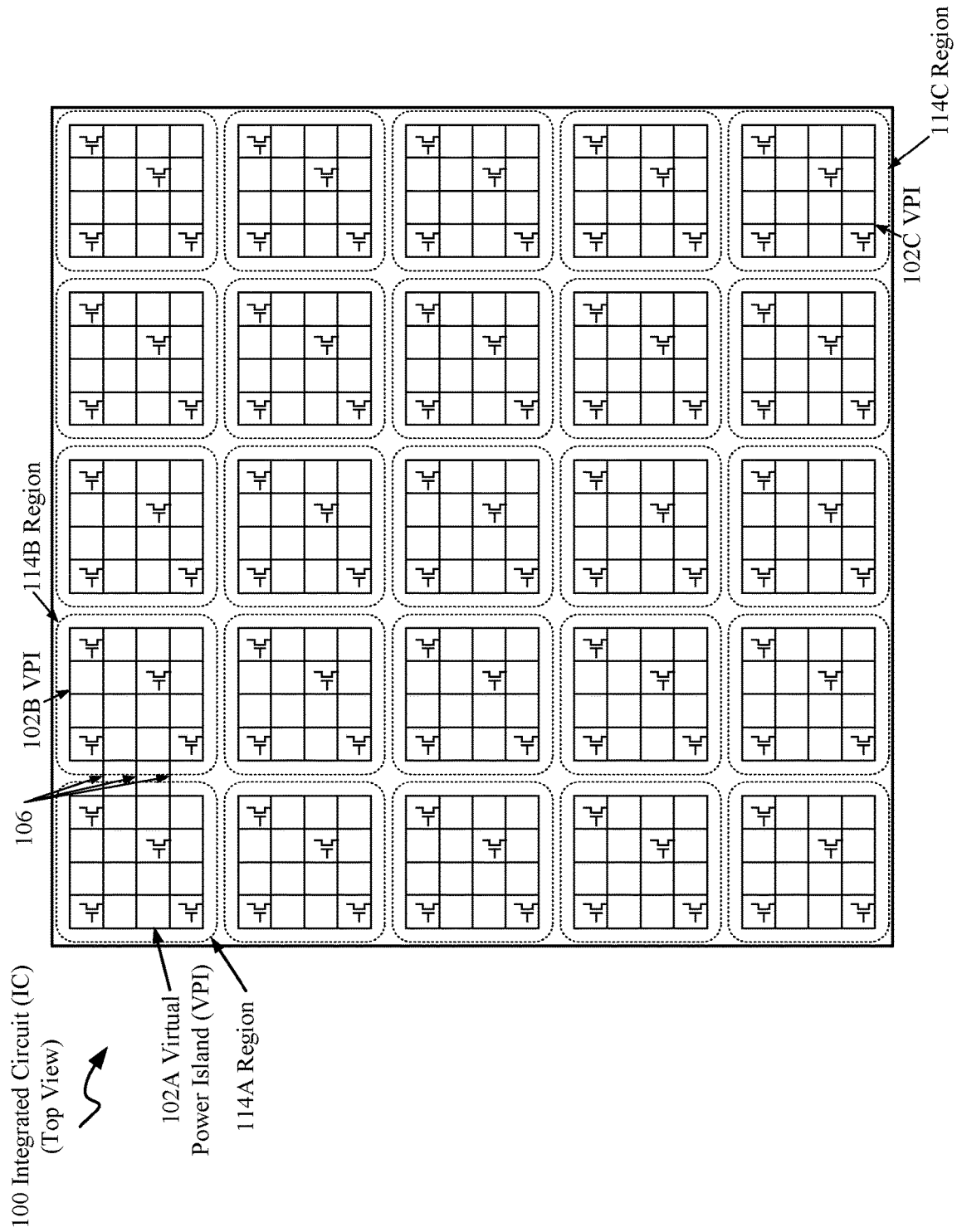
FIG. 1 depicts a top view of an example integrated circuit (IC) divided into regions each having a virtual power island (VPI), according to embodiments of the present disclosure.

While the disclosure is amenable to various modifications and alternative forms, specifics thereof have been depicted by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

In the drawings and the Detailed Description, like numbers generally refer to like components, parts, steps, and processes.

DETAILED DESCRIPTION

Certain embodiments of the present disclosure can be appreciated in the context of providing managed power supply distribution for certain regions of integrated circuits (ICs) such as processors and memory chips/units. Such managed power supply distribution can result in enhanced IC performance. Such ICs may be used to provide high-performance and high-reliability data processing capability for electronic devices including computing systems and servers. Such computing systems and servers may include, but are not limited to, web servers, application servers, mail servers, and virtual servers. While not necessarily limited thereto, embodiments discussed in this context can facilitate an understanding of various aspects of the disclosure. Certain embodiments may also be directed towards other equipment and associated applications, such as providing high-performance and high-reliability data processing capability to electronic equipment such as computing systems, which may be used in a wide variety of computational and data processing applications. Such computing systems may include, but are not limited to, supercomputers, high-performance computing (HPC) systems, and other types of special-purpose computers. Embodiments may also be directed towards providing high-performance and high-reliability data processing capability to consumer electronic devices such as cell phones, tablets, personal computers and Internet routing devices.

For simplicity of discussion, the terms "power supply voltage," "supply voltage" and "$V_{DD}$" are used interchangeably herein in reference to a voltage supplied to circuits within an IC. These terms are not limiting however; in certain IC technologies, other terms including, but not limited to, "$V_{CS}$," "$V_{CC}$," "analog supply voltage," "I/O supply voltage" and "DRAM voltage(s)" may also be used to refer to a voltage supplied to circuits within the IC. The terms "die," "IC," and "chip" are used interchangeably herein in reference to a section of semiconductor material on which circuits and interconnection wires are fabricated, in order to form a completed, functional integrated circuit.

Embodiments of the present disclosure can be useful for providing managed power distribution to an IC that includes sets of circuits having a variety of performance ranges. The metal interconnect structures used to provide such managed power distribution can be fabricated by using existing and proven IC design and fabrication techniques and IC materials sets. Embodiments of the present disclosure have the potential to recover significant numbers of otherwise useless IC die having insufficient frequency performance, and to transition very large numbers of other IC die from slower to higher performance products.

Digital ICs are generally designed so that sections of combinational logic circuits are located between and interconnected to groups of data storage elements, e.g., latches or flip flops. These combinational logic sections are generally timed, in a design process, to receive, following a clock edge, data from one set of data storage elements and deliver, prior to the arrival of the next clock edge, settled and valid logic outputs to another set of data storage elements. The combinational logic sections are timed, through a design process, to operate in conjunction with the data storage elements that are regularly clocked at a specified IC clock frequency.

In certain applications, a fabricated semiconductor die can experience unexpected performance variations between various areas or regions of the die. For example, variations in semiconductor fabrication process operations can result in one portion of a die performing intrinsically slower or faster than another portion. In general, larger semiconductor die can experience particularly large across-die performance variations. As another example, certain design processes and/or methodologies may be unable to completely and/or accurately model all of the factors which may contribute to reduced performance within a certain region(s) of the die. Such factors can include, for example, alternating current (AC) and direct current (DC) draw, circuit switch-factor loading, overall circuit timing and supply voltage transients. These factors can result in either instantaneous or continuous performance loss within certain region(s) of the die.

In certain fabricated IC designs, some sections of combinational logic circuits, located in certain regions of the die, may be able to operate at the specified IC clock frequency, while other sections of logic may not be able to operate at the specified IC clock frequency. Still other sections of combinational logic circuits, located in other regions may be able to operate above the specified IC clock frequency. The inability of one or more regions of the die to operate at the specified IC clock frequency can effectively limit the operating frequency of the entire die. The subset of combinational logic circuits on a die that limit overall die performance is often a small, systematic region having excess delay.

Semiconductor die performance limitations, as described above, can effectively decrease the yield of an IC having a specified IC clock frequency, which can increase the number of both scrap parts and the overall cost of parts that are functional at the specified IC clock frequency. In IC applications where it is permissible that the clock frequency of an IC can be reduced, performance limitations of the IC can cause an increase in the number of reduced-performance parts. For example, if ICs are sorted or "binned," IC performance limitations can result in an increase in the number of parts allocated to a lower-performing category or bin, which can result in a loss of profit for the IC manufacturer.

In some IC applications, increasing the overall operating supply voltage to an IC can possibly boost the performance of one or more reduced-performance region(s) of the IC, however such overall supply voltage elevation can dramatically and prohibitively increase overall IC die power dissipation. For example, ICs fabricated using 22 nm and 14 nm complementary metal-oxide semiconductor (CMOS) or silicon on insulator (SOI) technology nodes can experience power dissipation increases proportional to $(V_{DD})^3$; in other words, a relatively small increase in overall IC supply voltage can result in a very large increase in overall IC power dissipation. Such an increase in IC power dissipation can result in the power dissipation of the IC exceeding the ability of associated cooling devices, e.g., heat sinks or heat pipes, to effectively limit the temperature of the IC to a safe and/or reliable operating range.

According to embodiments, the reduced-performance region(s) of the die can be identified through hardware performance measurements/characterizations and/or design analysis, which can include, but is not limited to, timing and power supply droop/loading analysis. Once these reduced-performance region(s) of the die are identified, the performance of these particular region(s) can be enhanced by supplying a slightly increased supply voltage to them through a local "virtual power island" (VPI). In general, the performance of the relatively slow region(s) of the die can be enhanced to match the performance of the remainder of the die through a relatively small increase in local supply voltage, e.g., 10 mV to 20 mV. The increase in local supply voltage is sufficiently small that signal voltage level-shifting, between sets of circuits having slightly different supply voltages, is not required.

The slightly increased supply voltage can be applied through decreasing the resistance(s) from a global power distribution structure to a VPI supplying power to the reduced-performance region(s). The slightly increased supply voltage is supplied only to reduced-performance region(s), and not to the entire die. According to embodiments, the reduced-performance region(s) can be somewhat electrically isolated from other adjacent regions of the die through increasing the resistance(s) between the VPI and neighboring VPI(s) and other voltage supply sources.

According to embodiments, the application of slightly increased supply voltage(s) can be useful in enhancing the performance of these reduced-performance region(s) so they can operate at a specified IC clock frequency. As a result, the entire die can be enabled to operate at the specified IC clock frequency, which can be useful in increasing yields and decreasing the cost and quantity of scrap and/or quantity of out-of-specification ICs fabricated. If the ICs are sorted or binned, enhancing the performance of reduced-performance region(s) can result in the "recovery" of a significant number of ICs from a lower-performance category to a category that performs at the specified IC clock frequency. According to embodiments, the overall performance increase of an IC can be achieved while only incurring a relatively insignificant increase in overall IC power dissipation relative to the overall IC power dissipation resulting from increasing the supply voltage of the entire IC.

Certain embodiments relate to an IC configured to provide managed power distribution to circuits within a plurality of regions of the IC. Such managed power distribution can result in the performance enhancement of circuits located within reduced-performance regions of the IC. FIG. 1 depicts a top view of an example IC 100 divided into regions, e.g., 114A, 114B and 114C, each region including circuits and a VPI 102A, 102B and 102C, respectively, according to embodiments of the present disclosure. IC 100 can be, for example, an application-specific integrated circuit (ASIC), a processor, memory or special-purpose IC generally containing digital logic circuits. IC 100 can be fabricated with a wide variety of IC technologies and associated design methodologies, including, but not limited to, CMOS, SOI, gallium arsenide (GaAs) and silicon-germanium (SiGe) IC technologies.

The boundaries of the regions, e.g., 114A, can each be designated to include sets or groups of circuits, e.g., digital combinational logic or memory circuits, designed to operate within a specific, defined performance range, such as a clock frequency. According to embodiments, an electronic design automation (EDA) program can be used, in conjunction with a set of preliminary timing estimates and/or measured hardware performance metrics for circuits of the IC, to divide the IC 100 into a plurality of regions by designating the region boundaries. In some embodiments, the preliminary timing estimates or measured hardware performance metrics for circuits within the various regions of the IC may each fall within a unique range, and in some embodiments, the preliminary timing estimates or measured hardware performance metrics for circuits within two or more regions may each fall within a similar or identical range. Designating region boundaries that encompass circuits operating within specific performance ranges can be useful in determining which regions may receive an elevated supply voltage that can enhance the performance of the circuits within these regions.

For simplicity of illustration, the IC 100 and the regions, e.g., 114A, are each depicted as having a square shape; however this should not be construed as limiting. In embodiments, IC 100 can have a variety of width/height ratios. The boundaries of the regions of IC 100 can be square, rectangular, or may be any regular or irregular shape and size that is useful for bounding an area encompassing circuits operating within a specified performance range.

According to embodiments, the VPIs, e.g., 102A, located within each region are electrically conductive structures, including one or more wires electrically interconnected to supply power, e.g., $V_{DD}$, to the sets or groups of circuits contained within the corresponding local region. VPIs for adjacent regions can be used to distribute different supply voltages to the adjacent regions, depending on the voltage requirements for circuits within the regions. For example, a region containing circuits that are intrinsically slow may require an elevated supply voltage relative to an adjacent region containing intrinsically "nominal" or "fast" circuits.

FIG. 1 depicts a single VPI, e.g., 102A, per region, however this is not limiting. In some embodiments, each region may have a single VPI supplying a voltage to circuits within the region. In some embodiments, each region may include multiple VPIs supplying a voltage to circuits within the region, in accordance with the supply voltage requirements of the circuits. In addition, in some embodiments, an additional VPI may be used to supply a ground connection to circuits within the region.

Horizontal interconnect (HI) 106 includes one or more wires used to electrically interconnect adjacent VPIs, e.g., 102A and 102B. Such interconnection can be used to equalize supply voltages between adjacent regions, e.g., 114A and 114B, where each adjacent region contains circuits operating within a similar or identical defined performance range. According to embodiments, HIs 106 can be added or removed from an IC power distribution structure as needed, in order to distribute supply voltages appropriate to circuits within various regions.

Figure 2:
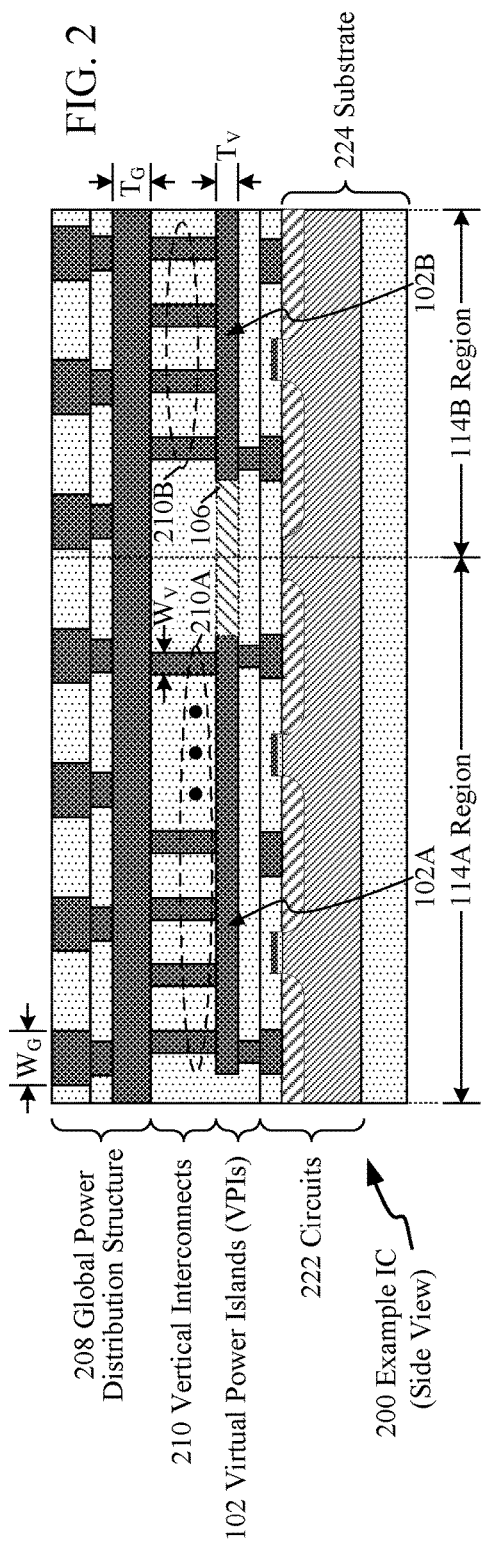
FIG. 2 is a side view of an example IC that includes a global power distribution structure and two VPIs, according to embodiments consistent with the figures.

FIG. 2 is a side view of an example IC 200 that includes a global power distribution structure 208, vertical interconnects (VIs) 210, VPIs 102, and HI 106, according to embodiments consistent with the figures. FIG. 2 can be useful for illustrating how the physical structure and electrical interconnections of these elements can create a power distribution network of the IC 200. Such a power distribution network can be useful for distributing a set of managed voltages to groups of the circuits 222 that are located in various regions, e.g., 114A and 114B, of the IC 200. In embodiments, the IC 200 can be divided into a plurality of regions through the use of an EDA program, in conjunction with a set of preliminary timing estimates. Circuits in each of the regions can have preliminary timing estimates within specific, unique ranges.

According to embodiments, circuits 222, fabricated within substrate 224 of IC 200, can include various types of transistors, e.g., N-channel field-effect transistor (NFETs), P-channel field-effect transistor (PFETs) and fin field-effect transistor (FINFETs), which can be interconnected to create higher-level circuits such as logic gates, logic macro functions and memory elements/arrays. Such higher-level circuits can be connected together to create chip-level functional units including, but not limited to, logic, processor, memory or special-purpose functions, in accordance with particular chip-level design specifications. IC 200 can be fabricated in a wide variety of IC technologies, including, but not limited to, CMOS and SOI.

For simplicity of illustration, a single power distribution network is depicted in FIG. 2, however, it can be understood that in the practice of the present disclosure, multiple power distribution networks may be used to distribute one or more supply voltage(s) and/or ground connections to the circuits 222. It may also be understood that the global power distribution structure 208, VIs 210, VPIs 102, and HI 106 may have dimensions consistent with those of metal interconnect structures, e.g., wires and vias, used in the fabrication of various types of ICs. According to embodiments, global power distribution structure 208 can be electrically connected to an off-chip voltage supply and can thus be used to distribute a supply voltage(s) to various regions of the IC 200.

In embodiments, global power distribution structure 208 can include electrically conductive wires located on one or more "upper" IC wiring planes, i.e., wiring planes located further from the IC substrate than "lower" wiring layers, e.g., VPIs 102, which may be used for local power distribution or local circuit interconnect. In some embodiments, global power distribution structure 208 can include wires located on two or more upper wiring planes, where the wires of one upper wiring plane are routed in a direction orthogonal to the wires located in another upper wiring plane. In this arrangement, the two sets of wires can be electrically connected with vias to form a "mesh" structure, consistent with the depiction of global power distribution structure 208.

In general, both the thickness $T_G$ and width $W_G$ of wires of a global power distribution structure are specified to be greater than the thickness $T_V$ and width $W_V$ of wires of VIs and VPIs. This enhanced thickness and width of a global power distribution structure, in conjunction with a highly interconnected, multi-plane mesh topology, can provide the global power distribution structure with a decreased overall resistance. Such decreased resistance can result in reduced voltage drop across the global power distribution structure, making it useful for distributing a relatively uniform supply voltage to various regions of the IC die.

For ease of illustration, a single global power distribution structure 208 is depicted in FIG. 2. However, in embodiments, multiple global power distribution structures can be used for providing/distributing multiple supply voltages and/or ground interconnections within an IC design.

According to embodiments, VIs 210 can be electrically connected to global power distribution structure 208 and can be used to distribute individual supply voltages to various VPIs 102 of the IC 200. For ease of illustration, FIG. 2 depicts two sets of VIs; 210A and 210B, which are connected to VPIs 102A and 102B, respectively, within regions 114A and 114B of IC 200, respectively. In embodiments, any number of sets of VIs may be connected to a global power distribution structure 208. The number of sets of VIs generally corresponds to the number of regions the IC is divided into, i.e., one group of VIs is generally used to connect a global power distribution structure 208 to one corresponding VPI. In embodiments, managed, e.g., increased, supply voltages are distributed as directly as possible, through a set of VIs, and/or one or more HIs, to the VPIs supplying the voltages to the logic circuits within their respective regions.

In embodiments, VIs can be vias, consistent with vias used to electrically interconnect wires or other conductive shapes located on different wiring planes of an IC. According to embodiments, both the number of VIs and the width or diameter, e.g., $W_V$ of VIs included within a group of VIs, e.g., 210A, contained in a preliminary power distribution structure can be modified, with an IC layout program, in order to manage the overall resistance of the group of VIs. Such VI resistance management can be useful in managing the supply voltage distributed to a particular VPI and circuits that the VPI is electrically connected to. The results of such modifications include IC design data such as a managed power distribution structure that can be stored in a computer-readable design file. In embodiments, sets of VIs can be used to distribute either a supply voltage or provide ground connection(s).

According to embodiments, VPIs 102 can be electrically connected to VIs 210 and can each be used to distribute unique, managed supply voltages to circuits 222 located within respective regions of the IC 200. For ease of illustration, FIG. 2 depicts two VPIs 102A and 102B, which are connected to circuits 222, located within respective regions 114A and 114B of IC 200. In embodiments, any number of VPIs can be connected to sets of VIs, e.g., 210A. The number of groups of VPIs generally corresponds to the number of regions the IC is divided into, i.e., one VPI is generally used as a supply voltage or ground connection structure for circuits within each respective region of the IC.

In embodiments, VPIs 102 generally include metal wires, consistent with wires used to electrically interconnect circuits of an IC. In some embodiments, VPIs 102 can include sets wires located on two or more lower wiring planes of the ICs, and vias that provide electrical interconnection between the two or more sets of wires. According to embodiments, the topology and dimensions of each VPI are generally designed and fabricated to provide a relatively uniform supply voltage, with minimal variation due to voltage drop, to all the interconnected circuits within its respective region of the IC. Each VPI can be used to distribute either a supply voltage or provide a ground connection.

According to embodiments, HIs 106 can be used to electrically interconnect adjacent VPIs of IC 200. For ease of illustration, FIG. 2 depicts a single HI 106, which interconnects two adjacent VPIs 102A and 102B, located within respective regions 114A and 114B of IC 200. According to embodiments, each HI, e.g., 106, can include one or more metal wires, consistent with wires used to electrically interconnect circuits of an IC. In some embodiments, HIs 106 can include sets wires located on two or more lower wiring planes of the ICs.

In embodiments, any number of HIs 106 can be used to electrically interconnect adjacent VPIs, e.g., 102A and 102B, of IC 200. Consistent with the use of VIs and VPIs described herein, HIs can be used to interconnect VPIs used for distributing a supply voltage or ground connection structure to circuits within various regions of the IC.

According to embodiments, a preliminary power distribution structure model can include any number of HIs electrically connected between adjacent VPIs within the IC. For example, in some embodiments, HIs may be included within a preliminary power distribution structure model to electrically interconnect all adjacent VPIs, in certain embodiments at least one HI may be included to electrically connect adjacent VPIs, and some embodiments, no HIs may be included. HIs included within a preliminary power distribution structure model may be assigned a preliminary resistance or impedance value. Such preliminary resistance values may be assigned through the use of one or more EDA tools or an EDA tool suite, which may include programs such as a circuit simulator, timing estimation program and IC layout program.

According to embodiments, the quantity and physical dimensions of any of the HIs included within a preliminary power distribution structure model can be modified, for example, through the use of one or more EDA tools such as an IC layout program. Such modifications may include, for example, adding, deleting, or changing the thickness, width or length of various HIs. Such HI modifications can be useful for increasing or decreasing the resistance value of various HIs from assigned preliminary resistance values. According to embodiments, changed resistance values may be subsequently included within a managed power distribution structure model of the IC.

Decreasing the resistance value of an HI can be useful for equalizing the supply voltage of two or more adjacent VPIs having identical target supply voltages. The decreased HI resistance can result in decreased transient variation of the supply voltage at both VPIs, due to sharing of the VI connections between the VPIs and the global power distribution structure.

Increasing the resistance value of an HI located between two adjacent VPIs can be useful for increasing the electrical isolation between the VPIs. Such electrical isolation may be useful in maintaining separate target supply voltages of adjacent VPIs when a specified or target supply voltage of one VPI has been elevated above, i.e., diverges from, the target supply voltage of an adjacent VPI. According to embodiments, the management of HI resistance values can be useful in supplying of managed target supply voltages to VPIs, which can result in enhanced circuit performance within particular regions of the IC. In some embodiments, reducing supply voltages within particular region(s) of the IC that exceed performance specifications can also be useful in reducing power dissipation of those region(s) and the IC in general.

Figure 3:
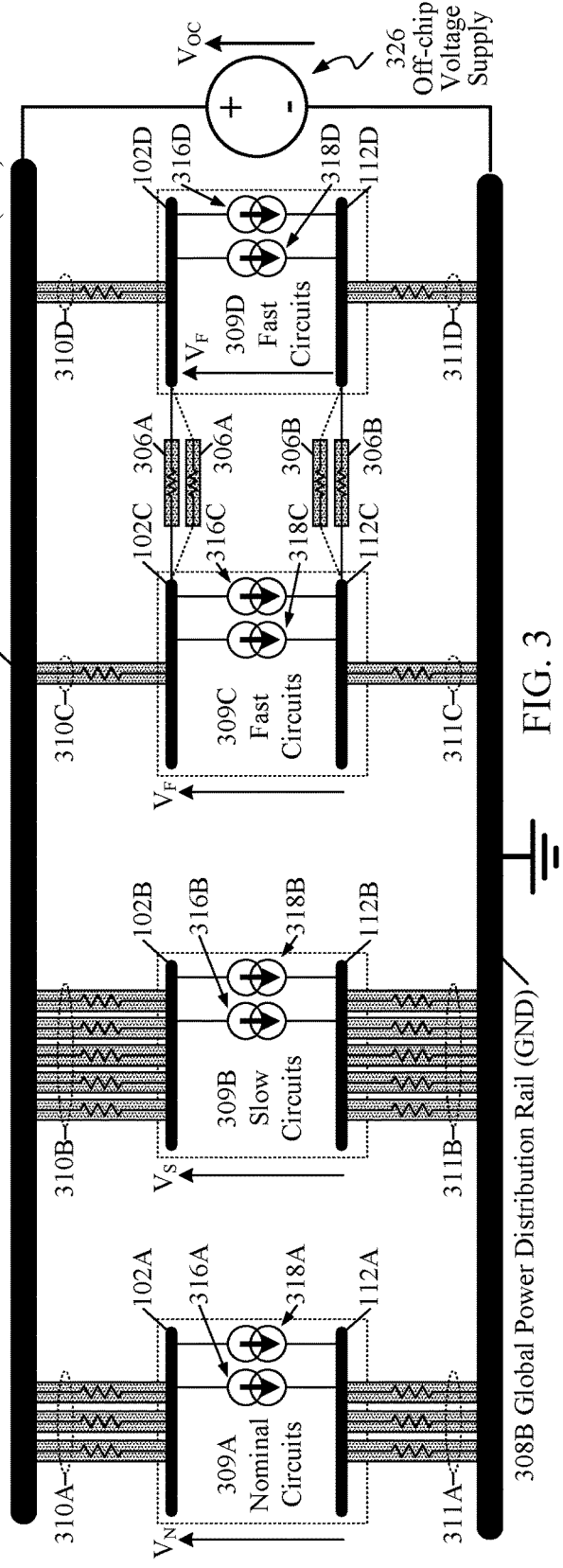
FIG. 3 is a schematic diagram of an example IC that includes global power distribution rails, vertical interconnects (VIs), horizontal interconnects (HIs), and four VPIs, according to embodiments consistent with the figures.

FIG. 3 is a schematic diagram of an example IC 300 that includes global power distribution rails 308A and 308B, VIs 310A-310D and 311A-311D, HIs 306A and 306B, and VPIs 102A-102D and 112A-112D, according to embodiments consistent with the figures. FIG. 3 can be useful for depicting electrical interconnections used to transfer power from a global power distribution structure, e.g., 308A, 308B, through VIs and HIs, to VPIs used to distribute power to circuits located in various regions of the IC 300. FIG. 3 can also be useful for providing an understanding of how the interconnection and modulation of various circuit elements can be used to deliver managed power distribution to various IC regions containing circuits having various ranges of preliminary timing estimates.

According to embodiments consistent with FIG. 2, global power distribution rails 308A and 308B each correspond to and schematically represent separate instances of global power distribution structure 208, FIG. 2. Global power distribution rail 308A is used to distribute a supply voltage, e.g., $V_{DD}$, while distribution rail 308B is used to supply ground connections to VPIs 112A-112D.

For simplicity of illustration, a single pair of global power distribution rails is depicted in FIG. 3, however, it can be understood that in the practice of the present disclosure, multiple power supply voltages may be distributed through multiple pairs of global power distribution rails, e.g., 308A and 308B. According to embodiments, global power distribution rails 308A and 308B can be electrically connected to off-chip voltage supply 326 and can be used to distribute a supply voltage, $V_{OC}$, to VIs in various regions of the IC 300. In embodiments, off-chip voltage supply 326 may include, for example a switching power supply that is electrically connected to the global power distribution rails of an IC 300 through wires within a printed circuit (PC) board. Consistent with global power distribution structure 208, FIG. 2, global power distribution rails 308A and 308B can provide relatively low resistance power distribution paths suitable for distributing a relatively uniform supply voltage to various regions of the IC die.

FIG. 3 includes depictions of four sets of circuits; nominal circuits 309A, slow circuits 309B and fast circuits 309C and 309D. Each of these four sets of circuits has a performance, i.e., timing, that lies within a particular range. According to embodiments, the performance of a set of circuits can be based on preliminary timing estimates from an EDA programs such as a circuit simulator or from IC performance measurements, i.e., hardware measurements. For example, the performance range of nominal circuits 309A is sufficiently fast for these circuits to produce correct results when clocked at a specified IC clock frequency. The performance range of slow circuits 309B can be insufficient for these circuits to produce correct results when clocked at the specified IC clock frequency; they will produce erroneous results at the specified clock frequency, although they may produce correct results if the IC clock frequency is sufficiently reduced. The performance range of fast circuits 309C and 309D is sufficiently fast for these circuits to produce correct results when clocked at and when clocked above the specified IC clock frequency.

Each of four sets of circuits 309A-309D receives a supply voltage, e.g., $V_N$, $V_S$ and $V_F$, through VPIs 102A-102D, respectively, and is each connected to a ground node through VPIs 112A-112D, respectively, consistent with the VPIs 102, FIG. 2. According to embodiments, sets of VIs 310A-310D and 311A-311D, consistent with VIs 210, FIG. 2, are electrically connected to global power distribution rails 308A and 308B, respectively. These VIs can be used to distribute individual supply voltages to various VPIs 102A-102D and provide ground connections to VPIs 112A-112D, respectively, of the IC 300. In embodiments, VIs can be vias, consistent with vias used to electrically interconnect wires or other conductive shapes located on different wiring planes of an IC.

For ease of illustration, FIG. 3 depicts four sets of VIs connected to VPIs that provide power and ground connections for the four sets of circuits 309A-309D. In embodiments, any number of sets of VIs, generally corresponding to the number of regions the IC is divided into and/or number of sets of circuits within the IC, may be connected to global power distribution rails 308A and 308B. FIG. 3 can be useful in enabling an understanding of the sets of VIs as resistive circuit elements within IC 300. According to embodiments, the resistance of sets of VIs can be modified through changing the quantity of parallel VIs included within a set and/or changing the diameter or width of one or more VIs.

According to embodiments, HIs, e.g., 306A and 306B include one or more wires that can be used to electrically interconnect adjacent VPIs of IC 300. For ease of illustration, FIG. 3 depicts two pairs of HIs 306A and 306B, which interconnect two pairs of adjacent VPIs 102C/102D and 112C/112D, respectively of IC 300. Such interconnection can be used to equalize supply voltages between adjacent VPIs, e.g., 102C and 102D that provide a supply voltage to regions of circuits generally operating within a similar or identical specified performance range.

Consistent with the use of HIs and VPIs described herein, HIs can be used to interconnect VPIs used for distributing a supply voltage, e.g., $V_{DD}$, or ground connection structure to circuits within various regions of the IC. In embodiments, any number of HIs can be used to electrically interconnect adjacent VPIs of IC 300. FIG. 3 can be useful in enabling an understanding of the sets of HIs as resistive circuit elements within IC 300. According to embodiments, the resistance of sets of HIs can be modified through changing the quantity of parallel HIs included within a set and/or changing the width or thickness of one or more HIs.

DC current sources 316A-316D can be useful in representing the DC or average operating current draw of sets of circuits 309A-309D, respectively. Similarly, AC current sources 318A-318D can be useful in representing the AC or peak operating current draw of sets of circuits 309A-309D, respectively. Both the AC and DC operating current draw of sets of circuits 309A-309D can be useful in calculating average and instantaneous voltage or "IR" drops across the resistance of VIs, e.g., 310A-310D, and HIs, e.g., 306A and 306B. Such voltage drops can alter both the average and instantaneous supply voltage provided to the sets of circuits, and the resulting performance or timing of the respective sets of circuits. FIG. 3 depicts a power distribution structure useful for managing power distribution to multiple sets of circuits having a range of supply voltages.

According to embodiments, the performance of circuits on IC 300 can be determined through preliminary timing estimates from an EDA program and/or from IC performance, i.e., hardware measurements. Following the determination of circuit performance, the circuits can be divided into various groups, e.g., nominal circuits 309A, slow circuits 309B and fast circuits 309C and 309D.

According to embodiments, in certain IC design scenarios the performance designation, e.g., "slow," "nominal," or "fast," of a particular group of circuits may be changed, based upon differences between performance determined from preliminary timing estimates and performance determined from actual, i.e., in situ, IC hardware measurements. Deficiencies and/or inadequacies in IC simulation software, models and methodologies, combined with application/environment-dependent circuit performance variations can both contribute to such performance differences.

As an example, two groups of circuits may each include a pre-defined processor core or set of combinational logic functions. Initial simulation of these two circuit groups may employ a "standard" set of test patterns/stimulus to exercise the two groups in a "typical" or "expected" workload. Preliminary timing estimates, generated by one or more EDA programs, may lead to the determination that both groups of circuits are expected to have "nominal" performance. However, when the two circuit groups are exercised in an actual IC, operating with and receiving stimulus from other circuits, one of the two circuit groups may receive stimulus that is significantly more active than the "standard" set of simulation test patterns used, while the other circuit group receives stimulus similar to the simulation test patterns. This activity increase for the one circuit group can result in an increase in AC and/or DC current draw, effectively reducing that circuit group's local supply voltage, thus causing a corresponding decrease in performance. Thus, one of the circuit groups that formerly was designated as having "nominal" performance, after hardware testing may be designated as having "slow" performance, which may require an increased local supply voltage in order to enhance the circuit performance into a "nominal" category.

This example is not limiting, however. According to embodiments, any of the performance designations, e.g., "slow," "nominal," "fast," or any other type of numerical or quantitative designation assigned to a group of circuits, may change following actual IC hardware testing. For example, groups of circuits designated, based upon simulation results, as "nominal" may be designated as "slow" or "fast" following IC hardware testing. Similarly, formerly "slow" circuits may be designated as "nominal" or "fast." Embodiments can be useful in assigning individual, initial performance designations to groups of circuits, and subsequently adjusting these performance designations in response to hardware performance measurements. As described herein, embodiments can provide managed local power supply voltages at particular VPIs, which can be useful in compensating for circuit group performance differences revealed following IC hardware performance testing. For example, if a particular group of circuits moves from a "fast" or "nominal" performance category to a "slow" performance category following IC hardware testing, the quantity and/or diameter of VIs interconnected to the VPI providing supply voltage to the group of circuits can be increased, in order to enhance the supply voltage and the resulting circuit performance. Similarly, the quantity and dimensions of HIs used to tie this VPI to adjacent VPIs can be decreased in order to provide electrical isolation between this VPI and adjacent VPIs.

It can be understood by those skilled in the art of advanced IC design that increasingly complex device patterning, layout and fabrication operations are often involved in the creation of the physical structures of an advanced IC, for example, one including SOI or FinFET devices. It can be both appreciated and demonstrated that a causal relationship can exist between completed device patterning, layout and fabrication operations within particular regions of an IC and a resulting intrinsic performance level of groups of circuits within those particular regions. Such operations can result in, for example a variation in a relative density of certain devices or features, e.g., FET gate structures or memory cells, within the region of the IC, which can, in turn, affect relative performance levels of some or all of the circuits within that region.

It can also be understood that the performance of certain regions of an IC can vary based upon a workload and/or application of the IC. For example, an IC that is a processor, or includes one or more processor core(s) may experience reduced performance within particular IC regions under particularly high workloads. Such specific workloads may include, for example, a relative large number of memory accesses, a high number of floating-point operations or frequent writing of data into caches within a given time period. Such high workloads may result in elevated current draw, resulting in increased voltage drops and corresponding reduction of circuit performance. Certain embodiments can be useful in providing for performance adjustment for certain IC regions that are known to suffer performance loss resulting from high workloads By way of example, in some embodiments, off chip voltage $V_{OC}$, supplied by off-chip voltage supply 326, can be 1.0 V or less, consistent with operating voltages of advanced CMOS and SOI circuit technologies. Due to the relatively low resistance of global power distribution rails 308A and 308B, the voltage delivered to the interconnections of VIs 310A and 311A with the global power distribution rails can also be approximately 1.0 V.

It is generally understood that CMOS and SOI circuits experience an increase in performance, i.e., faster operation, in response to an increase in supply voltage. Conversely, such circuits experience a decrease in performance, i.e., slower operation, in response to a decrease in supply voltage.

According to embodiments, the DC current draw, represented by DC current source 316A and the AC current draw, represented by AC current source 318A, can be used, in conjunction with preliminary timing estimates for nominal circuits 309A, to calculate the resistances of VIs 310A and 311A. In embodiments, resistances of VIs 310A and 311A are calculated so that nominal voltage $V_N$ is sufficient to enable nominal circuits 309A to produce stable, correct outputs when clocked at a specified IC clock frequency. Following this example, the total voltage drop across VIs 310A and 311A is calculated to be 30 mV, and the resulting nominal voltage $V_N$ is 0.97 V. If needed, various EDA tools such as an IC layout program can be used to adjust the quantity and dimensions of VIs 310A and 311A, provided in a model of the preliminary power distribution structure, in order to achieve a total voltage drop, across VIs 310A and 311A, of 30 mV.

The DC current draw, represented by DC current source 316B and the AC current draw, represented by AC current source 318B, can be used, in conjunction with preliminary timing estimates for slow circuits 309B, to calculate the resistances of VIs 310B and 311B. In embodiments, resistances of VIs 310B and 311B are calculated so that slow voltage $V_S$ is sufficient to enable slow circuits 309B to produce stable, correct outputs when clocked at the specified IC clock frequency. In this example, an increase of slow supply voltage $V_S$ of 20 mV above the nominal voltage $V_N$ of 0.97 V is calculated to be sufficient to enhance the performance of slow circuits 309B so that they can match the performance of the nominal circuits 309A. Increasing the slow supply voltage $V_S$ to 0.99 V can therefore be useful in enabling slow circuits 309B to produce stable, correct outputs when clocked at the specified IC clock frequency. Such an increase in the slow supply voltage $V_S$ can be particularly useful in eliminating slow circuits 309B from limiting the performance of the entire IC 300. Following this example, the total voltage drop across VIs 310B and 311B is calculated to be 10 mV, resulting in the slow voltage $V_S$ of 0.99 V. The quantity and dimensions of VIs 310B and 311B, provided in a model of the preliminary power distribution structure, can be altered in order to achieve a total voltage drop, across VIs 310B and 311B, of 10 mV.

Similarly, the DC current draw, represented by DC current source 316C and the AC current draw, represented by AC current source 318C, are used, in conjunction with preliminary timing estimates for fast circuits 309C, to calculate the resistances of VIs 310C and 311C. In embodiments, resistances of VIs 310C and 311C are calculated so that fast voltage $V_F$ is sufficient to enable fast circuits 309C to produce stable, correct outputs when clocked at the specified IC clock frequency.

In this example, a decrease of fast supply voltage $V_F$ of 20 mV below the nominal voltage $V_N$ of 0.97 V is calculated to be sufficient to enable the performance of fast circuits 309C to match the performance of the nominal circuits 309A. Decreasing the fast supply voltage $V_F$ to 0.95 V can therefore be useful in enabling fast circuits 309C to produce stable, correct outputs when clocked at the specified IC clock frequency while being particularly useful in a reducing the power consumption of fast circuits 309C.

Following this example, the total voltage drop across VIs 310C and 311C is calculated to be 50 mV, resulting in the fast voltage $V_F$ of 0.95 V. The quantity and dimensions of VIs 310C and 311C, provided in a model of the preliminary power distribution structure, can be altered in order to achieve a total voltage drop, across VIs 310C and 311C, of 50 mV. The calculations for fast circuits 309C can be similarly applied to fast circuits 309D. According to embodiments, electrical resistances of the sets of VIs can be configured to, during operation of the IC, provide a set of supply voltages to the VPIs within the IC regions. In some embodiments, the set of supply voltages can be within a range of +/−50 mV of the voltage provided to the global power distribution structure.

Is generally understood that circuits fabricated using certain IC technology nodes such as 22 nm and 14 nm CMOS or SOI can experience power dissipation increases proportional to $(V_{DD})^3$. In other words, a relatively small increase in overall IC supply voltage, e.g., $V_{DD}$, can result in a very large increase in overall IC power dissipation. Following the previous example, a 20 mV increase in an IC supply voltage of 1.0 V is equal to a 2% supply voltage increase. For such a 2% increase, the power dissipation of the circuit regions powered by the increased supply voltage is equal to $(1.02)^3=1.06$, or a 6% increase in power dissipation.

In the absence of the present disclosure, if an IC having a total power consumption of 150 W experiences a 2% overall power supply voltage increase, in order to enhance the performance of certain region(s) containing relatively slow circuits, the resulting total power dissipation of the IC would equal 150 W*1.06=159 W, an increase of 9 W. Similarly, a 3% increase of overall power supply voltage would result in the total power dissipation of the IC equaling 150 W*1.09=164 W, an increase of 14 W. Such overall IC power dissipation increases could have significant consequences with respect to overall system, power supply and cooling apparatus designs.

If, however, according to embodiments of the present disclosure, the increased supply voltage is selectively managed/applied to only regions of the IC containing relatively slow circuits, the increase in overall IC power consumption can be managed to be significantly smaller than the previous example. For example, for purposes of discussion, perhaps only one circuit region out of 1,000 circuit regions on the IC contains relatively slow circuits. Assuming that the power dissipation among the circuit regions is relatively uniform, the power dissipation of the one slow region is equal to 150 W/1000 or 0.15 W. Following with the previous calculations, 0.06*0.15 W=0.009 W, or a 0.006% increase in overall power dissipation, which may be generally regarded as negligible.

Further decreases in overall power consumption may similarly realized by the selective reduction of power supply voltages for regions containing relatively fast circuits, as described above. Embodiments of the present disclosure can therefore be particularly useful in providing managed supply voltage distribution while managing, limiting and/or reducing overall IC power dissipation. Such managed supply voltage distribution can be useful in enhancing overall IC performance, which may result in a corresponding increase in overall performance of an electronic system, such as a computer, containing the IC.

Figure 4:
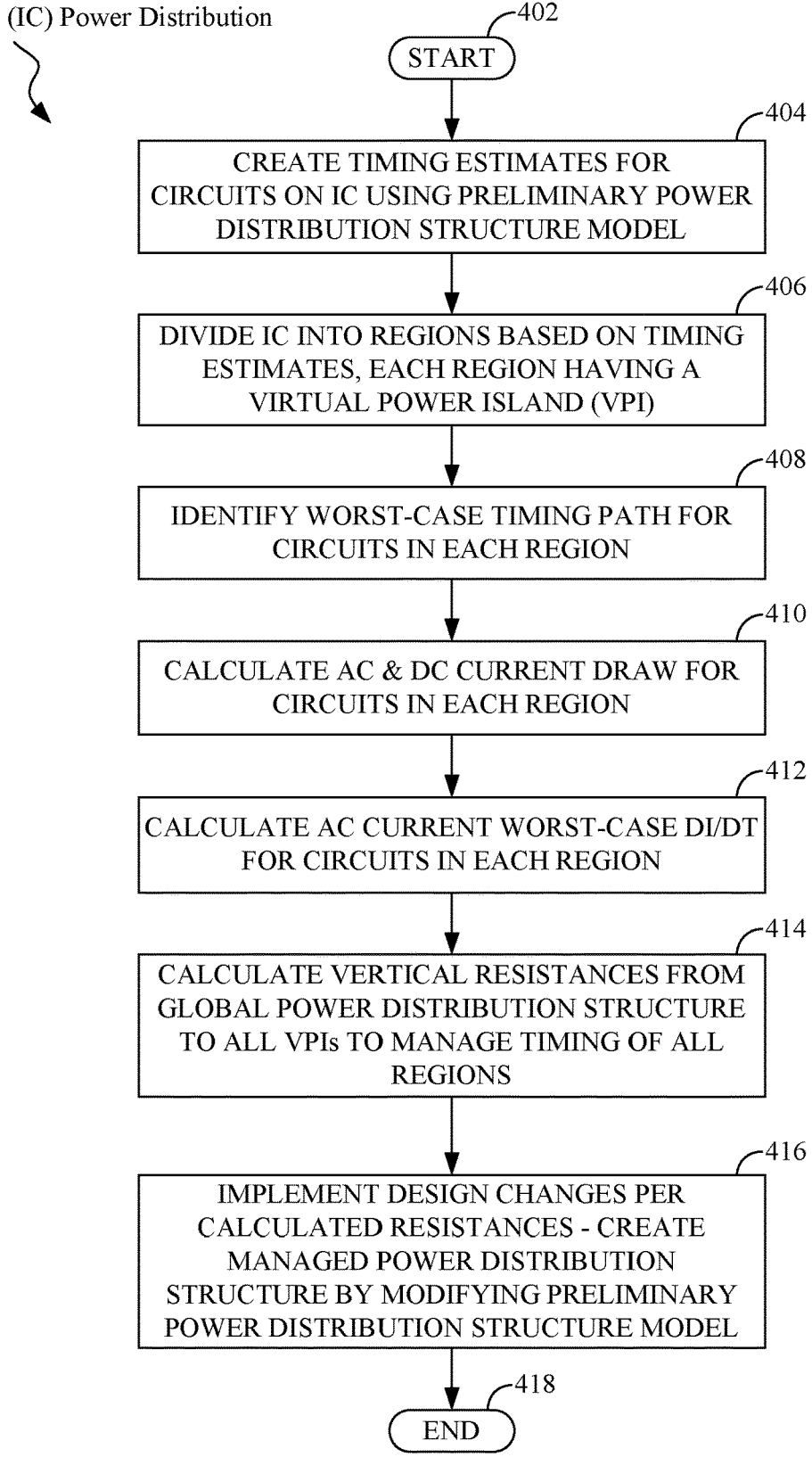
FIG. 4 is a flow diagram depicting a method for managing IC power distribution, according to embodiments consistent with the figures.

FIG. 4 is a flow diagram depicting a method 400 for managing IC power distribution, according to embodiments consistent with the figures. FIG. 4 depicts operations for implementing IC design changes to create managed power distribution structures useful for enhancing the performance of an IC. The operations described herein in reference to the method 400 generally correspond to FIGS. 1-3, and their associated descriptions.

It can be understood that modern IC designs frequently include an extremely large number, e.g., millions, of circuits such as transistors, gates, and logical functions. In embodiments, a correspondingly large number of mathematical and logical operations are performed on IC design data, as depicted in and described in reference to FIG. 4. These mathematical and logical operations can include calculations, estimations, identifications and modifications. It can be understood by one of skill in the art of IC design that the set of operations described in reference to FIG. 4, in the context of a modern IC design, is too numerous to be performed manually. These operations therefore must be completed by one or more EDA tools, in order for the design and fabrication of an IC according to embodiments to be practical.

The method 400 moves from start 402 to operation 404. Operation 404 generally refers to creating timing estimates for circuits on an IC through the use of a preliminary power distribution structure model. According to embodiments, an EDA program such as a timing estimation program can be used, in conjunction with a model of a preliminary power distribution structure, to create a set of preliminary timing estimates for circuits on the IC. The model of a preliminary power distribution structure of the IC can include, for example, one or more VIs interconnected between a global power distribution structure and one or more VPIs. The model of a preliminary power distribution structure can also include one or more HIs interconnected between adjacent VPIs. The timing estimation program can use the model of the preliminary power distribution structure to estimate both the DC and AC components of supply voltage(s) which may be distributed to each VPI/group of circuits of the IC. Such supply voltage estimations can be useful in scaling the supply voltage-dependent performance estimate(s) of these sets of circuits.

According to embodiments, the preliminary timing estimate can include metrics such as logic delay time(s) and/or combinational logic clock frequency. In some embodiments, preliminary timing estimates can be created solely from circuit simulation results, and in some embodiments, preliminary timing estimates can include both circuit simulation results and circuit performance metrics gathered from IC hardware testing. Once timing estimates for circuits on an IC have been created, the process moves to operation 406.

Operation 406 generally refers to dividing an IC into regions based upon preliminary timing estimates. According to embodiments, an EDA program can be used, in conjunction with the set of preliminary timing estimates for circuits of the IC, created in operation 404, to divide the IC into a number of regions. In embodiments, each of the regions can contain circuits having preliminary timing estimates that fall within a particular performance range. In accordance with examples provided above, the circuits within particular regions may be categorized as "nominal," "slow" and "fast," or maybe categorized are classified by other numerical ranges. According to embodiments, each performance range may be different than other performance ranges. Each of the regions can include a corresponding VPI that is electrically interconnected in order to distribute power to the circuits within the region. Once the IC has been divided into regions, the process moves to operation 408.

Operation 408 generally refers to identifying worst-case timing paths for sets of circuits within each region of the IC. According to embodiments, an EDA program such as the timing estimation program can be used to identify a worst-case timing path for each set of circuits within each respective regions of the IC. In some embodiments, the timing estimation program can rank and sort the set of preliminary timing estimates created in operation 404 in order to find the worst-case timing path for each region of the IC. In some embodiments, the worst-case timing paths for each IC region may be determined through IC hardware characterization/measurements, such as a sequential series of "pass/fail" tests of a processor IC run over an incrementally increased range of clock frequencies. The results of either the timing estimation program and/or hardware characterization can be useful in determining whether a set of circuits can produce stable, correct outputs when clocked at a particular frequency. Once worst-case timing paths for circuits within each region of the IC have been identified, the process moves to operation 410.

Operation 410 generally refers to calculating AC and DC current draws for circuits within each region of the IC. According to embodiments, an EDA program such as the circuit simulation program can be used to calculate an AC current draw and a DC current draw for each set of circuits within each respective regions of the IC. The circuit simulation program may make use of electrical parameters, such as power distribution structure network topology, VI resistance and HI resistance, contained within the preliminary power distribution structure model. Both the AC current draw and DC current draw may be useful in the calculation of parameters such as electrical resistance and quantities of VIs and HIs for a managed power distribution structure model. In some embodiments, the AC current draw and DC current draw for each IC region may be at least partially determined through IC hardware characterization/measurements. Once the AC and DC current draws for circuits within each region of the IC have been calculated, the process moves to operation 412.

Operation 412 generally refers to calculating worst-case AC transient currents for circuits within each region of the IC. According to embodiments, an EDA program can be used to calculate a worst-case AC transient current for each set of circuits within each respective regions of the IC. The EDA program may make use of electrical parameters, such as power distribution structure network topology and HI and VI resistance, contained within the preliminary power distribution structure model. The worst-case AC transient current may be useful in the calculation of parameters such as electrical resistance and quantities of HIs and VIs for a managed power distribution structure model. In some embodiments, the worst-case AC transient current for each IC region may be at least partially determined through IC hardware characterization/measurements. Once the worst-case AC transient currents for circuits within each region of the IC have been calculated, the process moves to operation 414.

Operation 414 generally refers to calculating vertical resistances between the global power distribution structure and all VPIs of the IC. According to embodiments, the EDA program can be used to calculate resistances of the sets of VIs used to electrically interconnect the global power distribution structure to corresponding VPIs within each region of the IC. In some embodiments, the EDA program can also be used to calculate resistances of each of the sets of HIs used to electrically interconnect adjacent VPIs within the IC. Such calculated VI and HI resistances can be useful in providing managed supply voltages to each of the VPIs that are appropriate to manage timing of circuits within each of the regions of the IC. Providing managed supply voltages to each of the VPIs can be useful in maintaining the performance of corresponding circuits within each of the regions within particular, specified performance ranges. Providing managed supply voltages to each of the VPIs can be useful in enhancing both supply voltage and performance for relatively slow circuits in particular regions of the IC, which can result in enhanced overall IC performance. In some embodiments, for example, an increase in supply voltage of 20 mV, relative to a nominal supply voltage, can be sufficient to equalize performance of relatively slow circuits to circuits performing within a nominal performance range. In some embodiments, a relative increase in supply voltage of 50 mV may be used to equalize the performance of slow circuits to the performance of nominal circuits. According to embodiments, calculating the resistances of the sets of VIs and HIs can be based upon the worst-case timing paths identified in operation 408, the AC and DC current draws calculated in operation 410, and the worst-case AC transient currents calculated in operation 412. Once the vertical resistances from the global power distribution structure to all VPIs of the IC have been calculated, the process moves to operation 416.

Operation 416 generally refers to implementing IC design changes, based upon the resistances calculated in operation 414, in order to create a managed power distribution structure. Such a managed power distribution structure can be useful in providing managed supply voltages, to each of the VPIs, appropriate to manage timing of circuits within each of the regions of the IC. In embodiments, implementation of IC design changes can be performed using an IC layout program to create a managed power distribution structure by modifying the preliminary power distribution structure. Both the preliminary power distribution structure and the managed power distribution structure are represented by IC design data that is contained in at least one computer-readable design file.

IC design changes/modifications can include, but are not limited to, modifying the dimensions, e.g., height or diameter, and/or quantities of VI(s) used to electrically interconnect the global power distribution structure to the various VPIs. IC design changes/modifications can also include modifying the dimensions, e.g., thickness, width or length, and/or quantities of HI(s) used to electrically interconnect adjacent VPIs. Once the IC design changes have been implemented, the method 400 may end at block 418.

Figure 5:
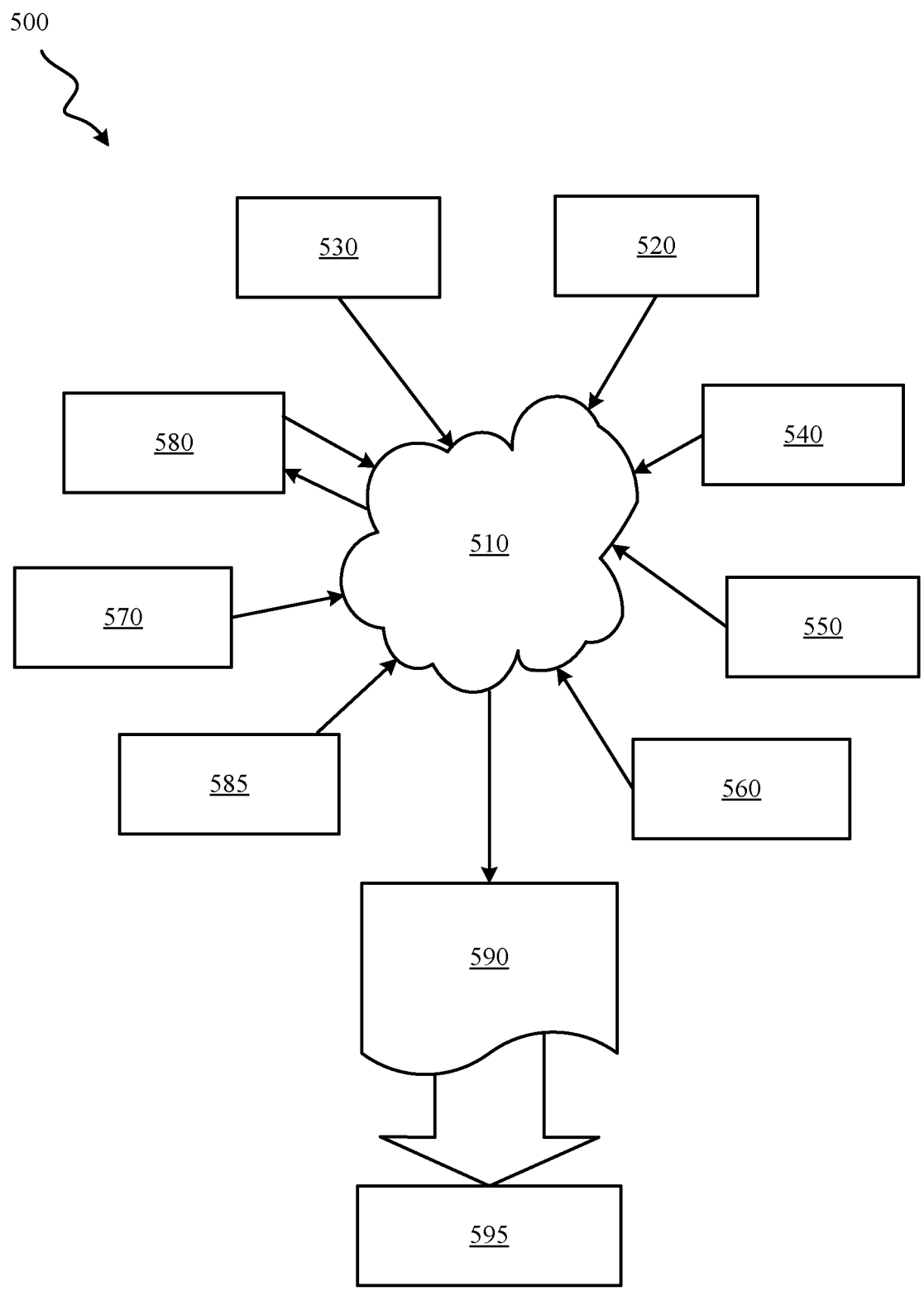
FIG. 5 depicts multiple design structures including an input design structure that is preferably processed by a design process, according to embodiments consistent with the figures.

FIG. 5 depicts multiple design structures 500 including an input design structure 520 that is preferably processed by a design process, according to embodiments consistent with the figures. Design structure 520 may be a logical simulation design structure generated and processed by design process 510 to produce a logically equivalent functional representation of a hardware device. Design structure 520 may alternatively include data or program instructions that, when processed by design process 510, generate a functional representation of the physical structure of a hardware device. Whether representing functional or structural design features, design structure 520 may be generated using electronic computer-aided design, such as that implemented by a core developer/designer. When encoded on a machine-readable data transmission, gate array, or storage medium, design structure 520 may be accessed and processed by one or more hardware or software modules within design process 510 to simulate or otherwise functionally represent an electronic component, circuit, electronic or logic module, apparatus, device, or system such as those depicted in FIG. 1-3, or a circuit personalized or modified by the methods described in reference to FIG. 4. As such, design structure 520 may include files or other data structures including human or machine-readable source code, compiled structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 510 preferably employs and incorporates hardware or software modules for synthesizing, translating, or otherwise processing a design/simulation functional equivalent of the components, circuits, devices, or logic structures depicted in FIG. 1-3, or a circuit personalized or modified by the methods described in reference to FIG. 4, to generate a Netlist 580 which may contain design structures such as design structure 520. Netlist 580 may comprise, for example, compiled or otherwise processed data structures representing a list of wires, discrete components, logic gates, control circuits, I/O devices, models, etc. that describe the connections to other elements and circuits in an integrated circuit design. Netlist 580 may be synthesized using an iterative process in which Netlist 580 is resynthesized one or more times depending on design specifications and parameters for the device. As with other design structure types described herein, Netlist 580 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 510 may include hardware and software modules for processing a variety of input data structure types including Netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 570, and test data files 585 which may include input test patterns, output test results, and other testing information. Design process 510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 510, without deviating from the scope and spirit of the disclosure. Design process 510 may also include modules for performing standard circuit design processes such as timing analysis, verification, design rule checking, place and route operations, etc.

Design process 510 employs and incorporates logic and physical design tools such as HDL compilers and simulation model build tools to process design structure 520 together with some or all of the depicted supporting data structures, along with any additional mechanical design or data, to generate a second design structure 590. Design structure 590 resides on a storage medium or programmable gate array in a data format used for the exchange of data of mechanical devices and structures (e.g., information stored on an IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that, when processed by an ECAD system, generate a logically or otherwise functionally equivalent form of one or more of the embodiments of the disclosure depicted in FIG. 1-3, or a circuit personalized or modified by the methods described in reference to FIG. 4. In one embodiment, design structure 590 may comprise a compiled, executable HDL simulation model that functionally simulates the devices depicted in FIG. 1-3, or a circuit personalized or modified by the methods described in reference to FIG. 4.

Design structure 590 may also employ a data format used for the exchange of layout data of integrated circuits and/or symbolic data format (e.g., information stored in a GDSII, GL1, OASIS, map files, or any other suitable format for storing such design data structures). Design structure 590 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and depicted in FIG. 1-3, or a circuit personalized or modified by the methods described in reference to FIG. 4. Design structure 590 may then proceed to a state 595 where, for example, design structure 590 proceeds to tape-out, is released to manufacturing, is released to a mask house, is sent to another design house, is sent back to the customer, etc.

The present disclosure may be a system, a method, a design structure and/or a computer program product. The computer program product may include a computer-readable storage medium (or media) having computer-readable program instructions thereon for causing a processor to carry out aspects of the present disclosure.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the above. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the above. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operations to be performed on the computer, other programmable apparatus or other device to produce a computer-implemented process, such that the instructions which execute on the computer, other programmable apparatus, or other device implement the functions/acts specified in the flowchart and/or block diagram block or blocks.

The flowchart and block diagrams in the FIGs. illustrate the architecture, functionality, and operation of possible implementations of systems, methods, and computer program products according to some embodiments of the present disclosure. In this regard, each block in the flowchart or block diagrams may represent a module, segment, or portion of instructions, which comprises one or more executable instructions for implementing the specified logical function (s). In some alternative implementations, the functions noted in the block may occur out of the order noted in the FIGs. For example, two blocks depicted in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the some embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. An integrated circuit (IC) configured to provide managed power distribution to circuits within a plurality of regions of the IC, the IC comprising:
    the plurality of regions of the IC, each region of the plurality of regions including a corresponding set of circuits that are electrically connected to a corresponding virtual power island (VPI) within the each region;
    a global power distribution structure configured to be electrically interconnected to an off-chip voltage supply;
    a plurality of sets of vertical interconnects (VIs), each set of VIs of the plurality of sets of VIs being electrically interconnected to a corresponding VPI within a corresponding region of the plurality of regions, each set of VIs of the plurality of sets of VIs also being connected to the global power distribution structure; and
    at least one horizontal interconnect (HI) electrically connected to a first VPI and electrically connected to a second VPI adjacent to the first VPI.

2. The IC of claim 1, wherein each set of VIs of the plurality of sets of VIs includes at least one via electrically interconnected to the global power distribution structure on a first wiring plane of the IC and to a VPI on a second wiring plane of the IC.

3. The IC of claim 1, wherein the at least one HI includes a metal wire.

4. The IC of claim 1, wherein the at least one HI includes a plurality of parallel-interconnected metal wires.

5. The IC of claim 1, wherein the at least one HI includes a via.

6. The IC of claim 1, wherein the global power distribution structure is electrically connected to an off-chip voltage supply that provides, to the global power distribution structure, a voltage less than 1.1 V.

7. The IC of claim 6, wherein electrical resistances of the plurality of sets of VIs are configured to, during operation of the IC, provide to the VPIs within the plurality of regions a set of supply voltages within a range of +/−50 mV of the voltage provided to the global power distribution structure.

8. The IC of claim 1, wherein a first electrical resistance of a first set VIs of the plurality of sets of VIs is different than a second electrical resistance of a second set VIs of the plurality of sets of VIs, the first electrical resistance and the second electrical resistance configured to, during operation of the IC, provide to a first VPI and to a second VPI, respectively, a first supply voltage and a second supply voltage, being different than the first supply voltage, that are respectively based on a first voltage supply requirement of a first set of circuits electrically connected to the first VPI that is different than a second voltage supply requirement of a second set of circuits electrically connected to the second VPI.

9. A design structure embodied on a non-transitory computer-readable storage medium readable by a machine used in design, manufacture, and simulation of an integrated circuit (IC) configured to provide managed power distribution to circuits within a plurality of regions of the IC, the design structure comprising elements that, when processed in a semiconductor manufacturing facility, produce an IC comprising:
    the plurality of regions of the IC, each region of the plurality of regions including a corresponding set of circuits that are electrically connected to a corresponding virtual power island (VPI) within the each region;
    a global power distribution structure configured to be electrically interconnected to an off-chip voltage supply;
    a plurality of sets of vertical interconnects (VIs), each set of VIs of the plurality of sets of VIs being electrically interconnected to a corresponding VPI within a corresponding region of the plurality of regions, each set of VIs of the plurality of sets of VIs also being connected to the global power distribution structure; and
    at least one horizontal interconnect (HI) electrically connected to a first VPI and electrically connected to a second VPI adjacent to the first VPI.

10. The design structure of claim 9, wherein each set of VIs of the plurality of sets of VIs includes at least one via electrically interconnected to the global power distribution structure on a first wiring plane of the IC and to a VPI on a second wiring plane of the IC.

11. The design structure of claim 9, wherein the at least one HI includes a metal wire.

12. The design structure of claim 9, wherein the at least one HI includes a plurality of parallel-interconnected metal wires.

13. The design structure of claim 9, wherein the at least one HI includes a via.

14. The design structure of claim 9, wherein the global power distribution structure is electrically connected to an off-chip voltage supply that provides, to the global power distribution structure, a voltage less than 1.1 V.

15. The design structure of claim 14, wherein electrical resistances of the plurality of sets of VIs are configured to, during operation of the IC, provide to the VPIs within the plurality of regions a set of supply voltages within a range of +/−50 mV of the voltage provided to the global power distribution structure.

16. The design structure of claim 9, wherein a first electrical resistance of a first set VIs of the plurality of sets of VIs is different than a second electrical resistance of a second set VIs of the plurality of sets of VIs, the first electrical resistance and the second electrical resistance configured to, during operation of the IC, provide to a first VPI and to a second VPI, respectively, a first supply voltage and a second supply voltage, being different than the first supply voltage, that are respectively based on a first voltage supply requirement of a first set of circuits electrically connected to the first VPI that is different than a second voltage supply requirement of a second set of circuits electrically connected to the second VPI.

17. A method, comprising:
identifying a slow performance circuit included in a first virtual power island (VPI) of a first region of an integrated circuit (IC), the IC including a plurality of regions, each region of the plurality of regions including a corresponding VPI electrically interconnected to supply power to circuits within the each region; and
modifying a preliminary power distribution structure of the IC to create a managed power distribution structure that, during operation of the IC, provides an increased supply voltage to the first VPI and a managed timing of the circuits within each region of the plurality of regions, wherein the managed power distribution structure includes:
a plurality of sets of vertical interconnects (VIs), each set of VIs of the plurality of sets of VIs being electrically interconnected to a corresponding VPI within a corresponding region of the plurality of regions, each set of VIs of the plurality of sets of VIs also being connected to the managed power distribution structure; and
at least one horizontal interconnect (HI) electrically connected to the first VPI and electrically connected to a second VPI adjacent to the first VPI.

18. The method of claim 17, wherein the modifying the preliminary power distribution structure includes modifying dimensions of the at least one HI.

19. The method of claim 17, wherein the modifying the preliminary power distribution structure includes modifying a diameter of at least one VI electrically interconnected to a global power distribution structure and to the first VPI.

20. The method of claim 17, wherein the modifying the preliminary power distribution structure includes changing a quantity of horizontal interconnects (HIs) electrically connected to the first VPI and electrically connected to the second VPI adjacent to the first VPI.

* * * * *